Aug. 22, 1967 M. A. POLINSKY 3,336,661

SEMICONDUCTIVE DEVICE FABRICATION

Filed Dec. 28, 1964 3 Sheets-Sheet 1

INVENTOR
MURRAY A. POLINSKY
BY
Glenn H. Bruestle
Attorney

INVENTOR.
MURRAY A. POLINSKY
BY
Glenn H. Bruestle
Attorney

INVENTOR.
MURRAY A. POLINSKY
BY
Glenn H. Bruestle
ATTORNEY

United States Patent Office 3,336,661

Patented Aug. 22, 1967

3,336,661

SEMICONDUCTIVE DEVICE FABRICATION

Murray Arthur Polinsky, Somerville, N.J., assignor to Radio Corporation of America, a corporation of Delaware Filed Dec. 28, 1964, Ser. No. 421,532

5 Claims. (Cl. 29—589)

This invention relates to improved methods of fabricating certain types of semiconductive devices having conductive channels therein, and more particularly to improved methods of introducing or forming the conductive channels in the devices. The devices produced as a result of the method are, themselves, improved in certain electrical characteristics.

Certain types of semiconductor devices include a crystalline semiconductive wafer having a thin conductive surface region or channel. Conductive regions have been formed in semiconductive wafers by alloying a quantity of a conductivity-determining substance or modifier (a substance which is either an acceptor or a donor in the particular semiconductor employed) with the surface of the wafer. Conductive regions have also been formed in semiconductive wafers by diffusing conductivity modifiers into all or part of the wafer surface, or by depositing heavily doped semiconductive material as a thin epitaxial layer on a high resistivity wafer of the same semiconductive material. In some kinds of semiconductor devices, such as field effect devices, it is desirable that the conductive channels in a large number of units be closely similar as to size, shape and resistivity, since these factors affect uniformity in the electrical parameters of the completed devices. It is also desirable in certain semiconductive devices, such as field-effect transistors, that the conductive channel be very thin. The prior art techniques have not been entirely satisfactory in these respects.

It is known that when some crystalline semiconductive wafers are heated to high temperature, a thin surface layer of the wafer is often converted to opposite conductivity type. For example, when a silicon wafer is heated in steam or in ordinary oxidizing ambients, such as moist air, to form a silicon oxide layer on the wafer surface, a thin layer-like surface region of the wafer immediately beneath the silicon oxide layer tends to become N-type if the wafer consists of a P-type or an intrinsic crystal. If the wafer consists of an N-type crystal, the surface region formed beneath the oxide layer is also N-type, but of greater conductivity than the bulk of the wafer. This surface region is also known as an inversion layer or region, since the conductivity type of the original wafer may be inverted in this surface region. However, the conductive surface region thus produced is not presently preferred for use as a conductive channel in the kind of field effect device known as an insulated gate field effect device, because the surface states of crystalline silicon wafers are very sensitive to surface preparation, oxidation processes, and the past history of the particular silicon wafer, so that the results obtained depend on the specific treatments utilized during fabrication. It is believed that N-type surface inversion layers formed by oxidizing P-types or intrinsic silicon in steam or in other conventional oxidizing ambients have a great many associated surface states which act as charge carrier traps, and tend to immobilize charge carriers, thus decreasing the transconductance of the device to unacceptable levels. For these reasons, conventional inversion layers in semiconductive wafers have not been entirely satisfactory for device fabrication.

It is an object of this invention to provide improved methods of fabricating improved semiconductor devices.

It is another object of the invention to reduce the time and cost of fabricating thin conductive channels in semiconductive wafers.

It is another object of the invention to improve the uniformity from device to device of the thin conductive channels which are made during the fabrication of certain types of semiconductive devices.

Another object of this invention is to provide improved methods of introducing conductive channels in semiconductive wafers.

Still another object is to provide improved methods of forming, in crystalline semiconductive wafers, conductive channels that are uniform from wafer to wafer as to resistivity.

These and other objects of the invention are accomplished by heating a crystalline silicon body in a moisture-containing ambient, the time and temperature of said heating step being sufficient to form a silicon oxide coating over the surface of the body. The silicon body is next reheated in a dry atmosphere, the time and temperature of the reheating step being sufficient to reduce the density of charge carrier traps on the surface of the body adjacent the silicon oxide coating. The silicon body is then heated in a reducing atmosphere to form a thin conductive surface region immediately adjacent the silicon oxide coating.

The invention and its features will be described in greater detail with reference to the accompanying drawing, in which.

The type of semiconductor device in which the conductivity of a portion of a semiconductive wafer may be modulated by an applied electric field is known as a field-effect device. One kind of field-effect device consists of units which have an insulating layer or film over a portion of the surface of a crystalline semiconductive wafer, and have a control or gate electrode disposed on this insulating layer. Units of this kind are known as insulated-gate field-effect devices, and generally comprise a wafer of crystalline semiconductive material, two spaced conductive regions extending inward from one face of said semiconductive wafer, a film of insulating material on said one face between said two spaced regions, two metallic electrodes bonded respectively to said two spaced conductive regions, and a metallic control electrode on the insulating film between the two spaced conductive regions.

One class of insulated-gate field-effect device is known as the MOS (Metal-Oxide-Semiconductor) transistor, and is described by S. R. Hofstein and F. P. Heiman in "The Silicon Insulated-Gate Field-Effect Transistor," Proceedings IEEE, volume 51, page 1190, September 1963. In devices of this type, the metallic control electrode on the insulating film (the film usually consists of silicon oxide) is also known as the gate electrode, while the two electrodes bonded directly to the semiconductive wafer are known as the source and drain electrodes.

MOS transistors may be of two general types, one type being known as the enhancement type, and the other as the depletion type. In depletion type MOS transistors, there is a thin conductive channel adjacent the wafer surface between the source and drain regions, and, in devices of this type, a source-drain current can flow when the gate-source bias is "zero." When a negative gate-source bias is applied to depletion type MOS transistors, the conductivity of the N-type conductive channel is decreased or "pinched off," and the source-drain current is decreased. When a positive gate-source bias is applied to these devices, the conductivity of the channel increases, and the source-drain current increases. Thus both positive and negative gate-source bias are effective in modulating the source-drain current of depletion type MOS transistors.

Although the invention will be described in terms of a depletion type MOS transistor as a specific example, it will be understood that the invention will be applicable to other semiconductor devices, in which a thin conductive channel is provided in a crystalline semiconductive wafer beneath an insulating layer.

*Example I*

Figures 1, 2:
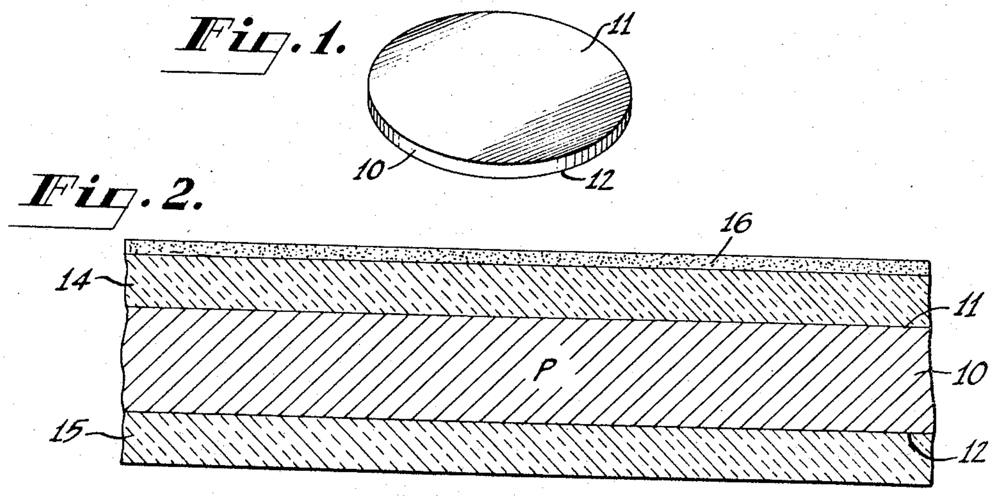
FIGURE 1 is a perspective view of a semiconductive wafer.
FIGURES 2–9 are cross-sectional views of a portion of the semiconductive wafer of FIGURE 1 during successive steps in the fabrication of a semiconductor device in accordance with one embodiment of this invention.

A crystalline semiconductive silicon wafer 10 (FIGURE 1) is prepared with two opposing major faces 11 and 12. The exact size, shape, conductivity type, and resistivity of wafer 10 is not critical. Wafer 10 may be of P-type conductivity, or intrinsic, or of light N-type conductivity. In this example, wafer 10 is a disc-shaped transverse slice of a monocrystalline P-type silicon ingot prepared by the Czochralski pulling technique, and has a resistivity of about 1 to 100 ohm-cm. Suitably, wafer 10 is about ¾" in diameter and 6 mils thick.

Silicon oxide coatings are deposited over the faces of wafer 10 by any convenient method. Since this coating is subsequently removed, its exact thickness is not critical. When wafer 10 consists of silicon, as in this example, the silicon oxide coating may be formed by heating the wafer in steam for about 30 minutes at 1250° C. Silicon oxide coatings 14 and 15 about 2000 to 4000 Angstroms thick (FIGURE 2) are thus grown on faces 11 and 12 respectively of wafer 10. A thin layer 16 of a photoresist is deposited on one oxide coating 14. The photoresist may, for example, be a bichromated protein such as bichromated gum arabic, bichromated gelatin or bichromated albumen. Alternatively, a commercially available photoresist such as light-sensitive film-forming polyesters derived from 2-propenylidine malonic compounds and bifunctional glycols containing two to twelve carbon atoms may be utilized.

The photoresist layer 16 is exposed to a suitable light pattern, and developed; those portions of the photoresist not exposed to light are removed by means of a solvent, thereby exposing portions of silicon oxide layer 14; the hardened (polymerized) portions of the photoresist which remain on the silicon oxide layer 14 serve as a mask during the subsequent etching step.

Figure 3:
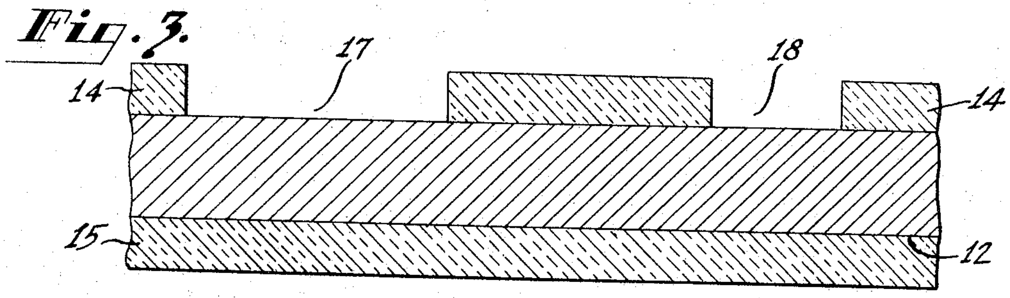
Figure 4:
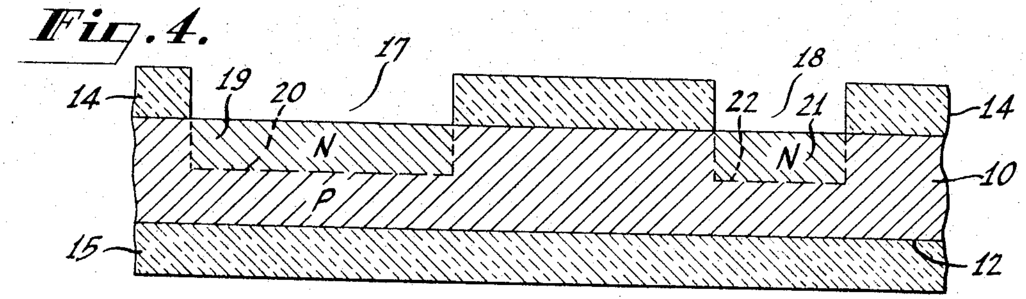

The exposed portions of the silicon oxide layer 14 are removed by means of an etchant such as hydrofluoric acid solution. The polymerized portions of the photoresist are then removed by a suitable stripper such as methylene chloride, leaving wafer 10 as in FIGURE 3, with a pair of openings 17 and 18 in the silicon oxide layer 14.

The exact size and shape of openings 17 and 18 are not critical; they may be regular shapes such as polygons or circles, or may be irregular in shape. When the source and drain regions of an MOS transistor have the same size and shape, the device is symmetrical, that is, the source and drain regions may be interchanged without affecting the electrical characteristics of the device. It has been found that improved results at elevated frequencies are obtained by making the drain area of an MOS transistor very small. The source area does not appreciably affect the high frequency performance, and hence may be made relatively large for greater ease in bonding lead wires. In this example, both openings 17 and 18 are rectangular in shape, but the area of one opening 18 used for diffusing the drain region is made very small, for example, about 30 square mils, and is smaller than the area of the other opening 17, which is used to form the source region of the device.

It will be understood that only a single portion of the slice 10 is shown in FIGURES 2–9, and that the pattern of pairs of adjacent openings 17 and18 within oxide layer 14 may be repeated many times in a regular array on face 11 of wafer 10.

Wafer 10 is now heated in an ambient containing phosphorus pentoxide vapors for about 10 to 20 minutes at about 1000° C. Phosphorus diffuses into the exposed regions 19 and 21 (FIGURE 4) of wafer 10 immediately beneath openings 17 and 18 respectively. Since phosphorus is a donor in silicon, and the wafer 10 is originally of P-type conductivity, rectifying barriers or p-n junctions 20 and 22 are formed at the boundaries between the N-type phosphorus-diffused regions 19 and 21 and the P-type bulk of wafer 10. Under these conditions, the phosphorus-diffused regions 19 and 21 may be about 5000 to 20,000 Angstroms thick. In this example, the exposed surface areas of region 21 is less than the surface area of region 19, as the area of opening 18 was less than the area of opening 17.

Figure 5:
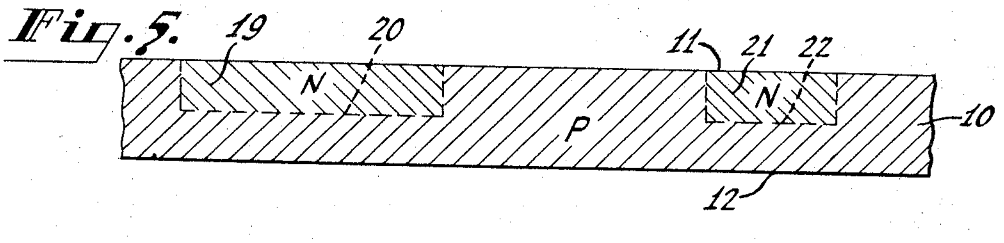
Figure 6:
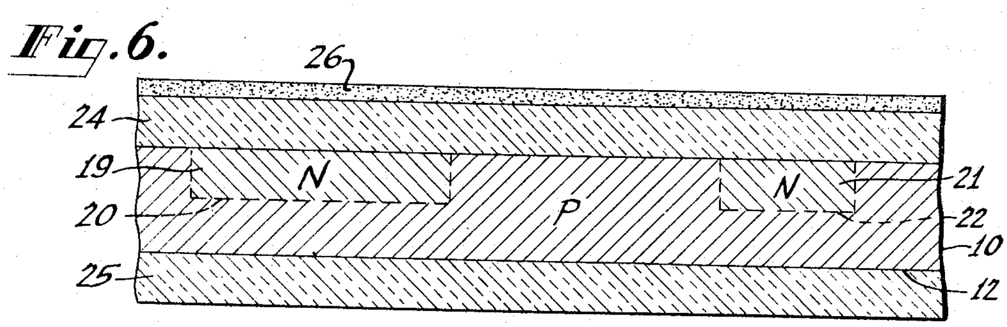
Figure 7:
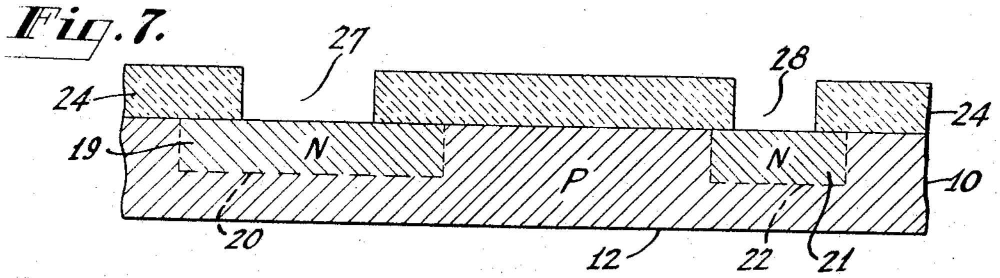
Figure 8:
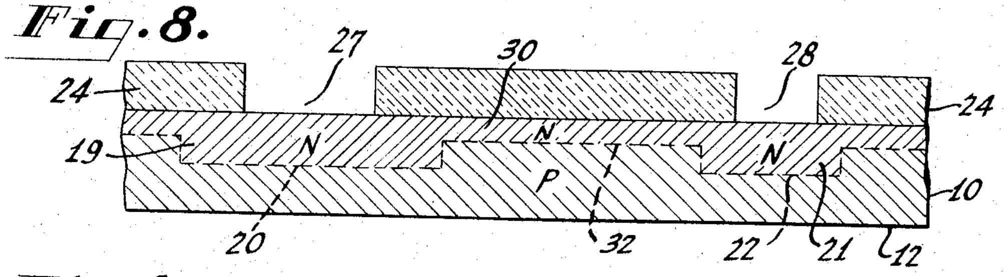
Figure 9:
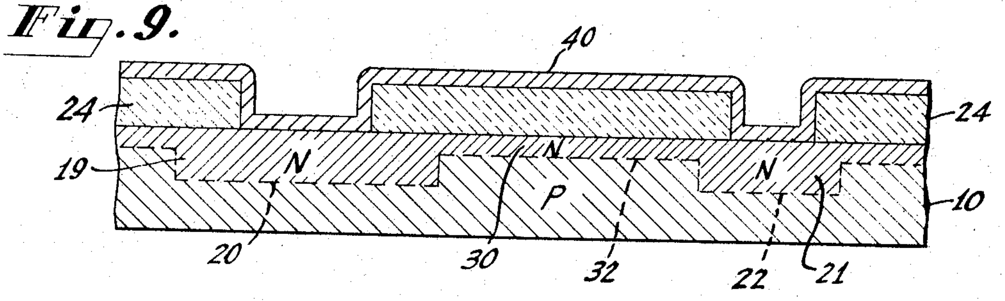

Wafer 10 is now treated in an etchant containing hydrofluoric acid so as to completely remove oxide layer 15 and the remaining portions of oxide layer 14, leaving the wafer as in FIGURE 5.

Wafer 10 is now reheated in a moisture-containing oxidizing ambient for a time and at a temperature sufficient to form a silicon oxide layer thereon. The exact time and temperature of this heating step are not critical. At lower temperatures, a longer heating time is required to produce the same coating thickness. The oxidizing ambient may consist of moist air, moist oxygen, steam, mixtures of these, and the like. Even reducing gases such as hydrogen and forming gas, or inert gases such as nitrogen, may be utilized for this purpose provided they are bubbled through water so as to be saturated with water vapor. The temperature range for this heating step is preferably about 700° to 1300° C., and the duration of heating is suitably about 15 minutes to 4 hours. In this example, wafer 10 is heated in steam at a temperature of about 950° C., to form silicon oxide layers 24 and 25 (FIGURE 6) about 2000 Angstroms thick on the major faces 11 and 12 respectively of wafer 10. The oxide layers 24 and 25, when thus formed, are dense, adherent to the wafer 10, and are relatively free from pinholes and other defects. At the same time, a surface inversion layer (not shown) is formed in the wafer 10 immediately adjacent major faces 11 and 12. However, as previously noted, the surface inversion layer formed under these conditions contains a great many surface states which act as traps for charge carriers, and improvement is desirable for device fabrication. Moreover, the surfaces of wafer 10 are not as passive as is desirable in the completed devices.

A more satisfactory inversion layer may be produced by first reheating the wafer 10 in a dry ambient, and then heating the wafer in a reducing ambient. The dry ambient may consist of dry oxygen or dry nitrogen or dry argon or the like. The step of reheating the silicon body in a dry atmosphere is preferably conducted at a temperature of about 700° to 1300° C. The exact heating period is not critical, and may be varied from about 2 minutes to 10 hours. It has been discovered that this step removes the variable inversion layer previously formed by heating the wafer in a moist ambient. At the same time, the density of surface states which act as charge carrier traps is reduced.

In this example, the dry ambient consists of oxygen which has been passed through a cold trap containing methanol and Dry Ice to freeze out the water vapor present in the oxygen. The silicon oxide layers 24 and 25 are exposed to this dry ambient and wafer 10 is heated for about 1 hour at about 900° C. During this step there is very little change in the thickness of the silicon oxide layers 24 and 25, because silicon oxide surface layers grow rapidly on silicon maintained in a wet ambient, but grow slowly on silicon maintained in a dry ambient. The wafer is cooled to room temperature in the same dry ambient.

A thin layer 26 (FIGURE 6) of photoresist is now deposited on silicon oxide coating 24. The photoresist layer 26 is exposed to a suitable light pattern. Unexposed portions of the photoresist 26 are removed by any suitable solvent, thereby exposing areas of the silicon oxide layer 24. The exposed areas of silicon oxide 24, as well as all of the silicon oxide layer 25, are then removed by means of a hydrofluoric acid solution. The remaining portions of the photoresist are removed with a suitable stripper, leaving the wafer 10 as in FIGURE 7, with contact openings 27 and 28 extending through the oxide coating 24. The exact size and shape of contact openings 27 and 28 are not critical, but openings 27 and 28 are entirely within the surface boundary of the phosphorus-diffused regions 19 and 21 respectively.

Wafer 10 is now heated in a reducing ambient such as hydrogen, or mixtures of hydrogen and a non-oxidizing gas such as argon or nitrogen. Mixtures of nitrogen and a few volume percent hydrogen, known as forming gas, are useful for this purpose. A suitable forming gas consists of 90 volumes of nitrogen and 10 volumes of hydrogen. Heating may suitably be at a temperature of about 200° C. to about 1000° C. The duration of heating is suitably about 2 minutes to 2 hours. At about 1000° C., a heating period of about a minute is sufficient. If the heating temperature is decreased, the duration of heating should be increased to achieve similar results. During this step, a thin surface region 30 (FIGURE 8) of wafer 10 beneath the silicon oxide coating 24 is converted to N-type conductivity. The thin surface region 30 is known as an inversion layer, and can be utilized as a conductive channel. A p-n junction 32 is formed at the boundary between the inversion layer 30 and the bulk of wafer 10. The inversion layer 30 thus formed is too thin for accurate direct measurement. The thickness of the wafer regions in the drawing are not to scale, and have been exaggerated for greater clarity. Layer 30 is estimated to be of the order of 100 Angstroms thick. Although the thickness of the conductive channel or inversion layer 30 is thus less than the length of a single wave of visible light, the presence of the conductive channel 30 after this treatment may be demonstrated by positioning two spaced probes against the wafer surface, on the diffused regions 19 and 21 respectively, and measuring with an ammeter the current which flows between the two probes for a given applied voltage. When such measurement is made on a wafer that does not have a conductive channel or surface region, the assemblage acts like a pair of diodes back-to-back, and very little current flows. When such measurement is made on a wafer that does have a conductive channel or surface region 30 between the regions 19 and 21, a substantial current flows for a similar applied voltage.

An important advantage of the conductive channel 30, when thus formed, is that it is relatively free from traps, thus enabling the fabrication of devices which exhibit good transconductance.

Another advantage of this method is that the resistivity of the conductive channel thus formed may be measured before completion of the device by contacting two spaced probes against the exposed portion of the phosphorus-diffused regions 19 and 21. If the measured resistivity is too high, the device may be reheated in the hydrogen-containing ambient to increase the conductivity of the inversion layer 30. Suitably, the resistance of the device channel thus measured is at a value between about 100 ohms to 10,000 ohms.

If desired, the method may be modified to employ continuous monitoring of the conductivity of the conductive channel 30 during the step of heating the silicon body 10 in a hydrogen-containing ambient such as forming gas. Two spaced probes are directed against the regions 19 and 21 when the wafer is positioned in the furnace, and the amount of current flowing between the two probes for a given voltage is continuously measured during the heating step. The apparatus may be arranged so that when a given value of current flows between the two probes, the furnace is automatically turned off.

Figure 10:
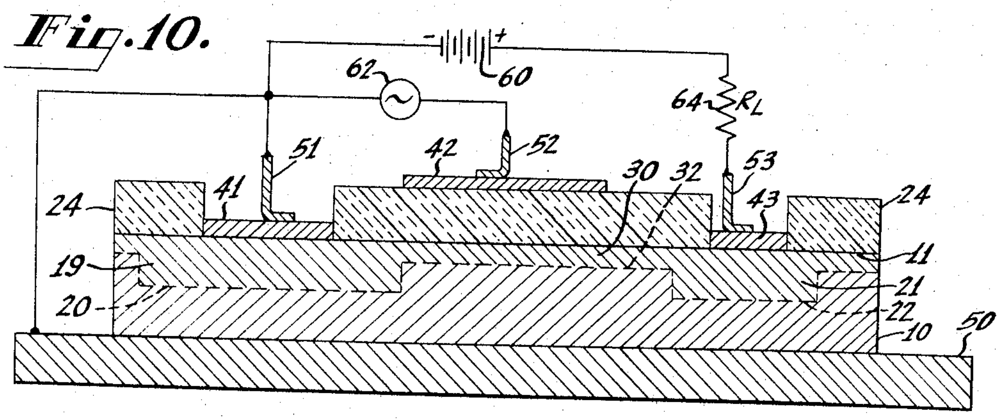
FIGURE 10 is a cross-sectional view of a completed device fabricated according to the embodiment of FIGURES 2–9, together with a schematic circuit; and, FIGURE 11 is a plot of the electrical characteristics of the device of FIGURE 10, showing the characteristic variation of source-drain current with source-drain voltage for different values of source-gate bias.

The silicon body 10 is cooled to room temperature and a film 40 (FIGURE 9) of conductive metal is deposited by any convenient method over the remaining portion of oxide layer 24 and over the exposed portions of wafer face 11. In this example, film 40 consists of aluminum, is about 3000 to 6000 angstroms thick, and is deposited by evaporation. Desired portions of the aluminum film 40 on wafer regions 19 and 21 and on a portion of the oxide layer are now masked, utilizing either the photoresist techniques described above, or an acid resist (not shown) such as paraffin wax, apiezon wax, and the like. The unmasked portions of metal film 40 are removed by means of a suitable etchant, and the resist is dissolved by a suitable organic solvent, leaving one portion of metallic film 40 as an electrode 41 (FIGURE 10) in contact with wafer region 19, another portion as an electrode 43 in contact with wafer region 21, and a third portion as an electrode 42 on the silicon oxide coating 24 over the conductive channel 30.

The device is completed by bonding electrical lead wires 51, 52 and 53 to electrodes 41, 42 and 43 respectively, by any convenient method, such as soldering, or thermocompression bonding. The silicon wafer or slice 10 is now diced into units, and each unit 10' (FIGURE 10) is mounted with its major face 12 down on a metallic header 50. The subsequent steps of encapsulating and casing the device are accomplished by standard techniques of the semiconductor art, and need not be described here.

The device of this example may be operated as follows. Leads 51 and 53 are the source and drain leads respectively, while lead 52 is the control or gate lead. A source of direct current potential such as a battery 60 is connected between source lead 51 and drain lead 53, so that the source electrode 41 and the source region 19 of the device are poled negative relative to the drain electrode 43 and the drain region 21. The header 50 is electrically connected to the source lead 51, and a source 62 of signal potential is connected between the gate lead 52 and the source lead 51. If desired, in addition, a source of constant voltage bias (not shown) may be supplied between the gate lead 52 and source lead 51 in series with the signal source 62. The load, shown as a resistance 64 is connected between the positive terminal of battery 60 and the drain lead 53. The output signal is developed across the load resistor 64.

Figure 11:
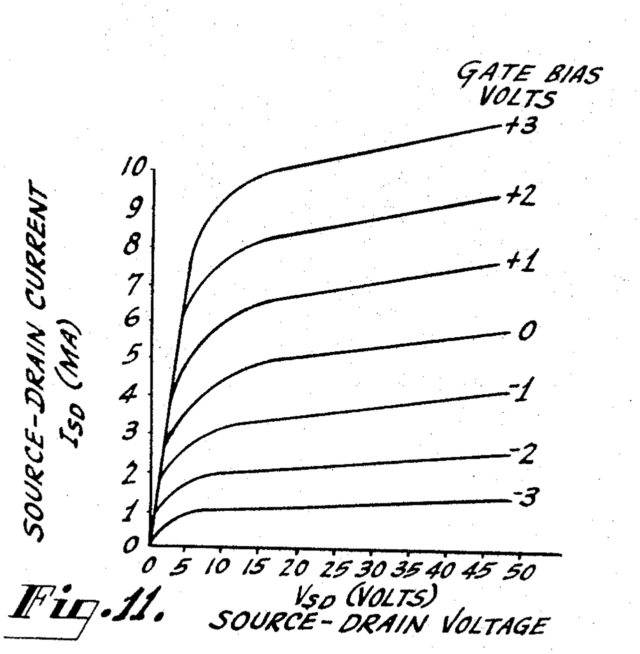

The characteristic curves of one depletion type MOS transistor made according to this example, obtained by plotting source-drain current, measured in milliamperes, against source-drain voltage, measured in volts, for different values of positive and negative gate-to-source bias in volts, are shown in FIGURE 11. Depending on the times and temperatures of the process, the source-drain current for zero gate-source bias may be raised or lowered. By increasing the period of treatment in a hydrogen-containing ambient, the conductivity of the channel 30 in the device is increased, and hence the amount of source-drain current which flows at zero gate-source bias is increased.

*Example II*

Whereas in Example I, the silicon wafer was P-type, in this example, the semiconductive wafer or slice 10 (FIGURES 1–10) consists of intrinsic silicon having a resistivity of about 100 ohm-cm., and the conductivity modifier diffused into the wafer is arsenic. The steps of masking one face 11 of the silicon wafer 10 with a suitable mask such as silicon oxide layer 14, then diffusing arsenic into selected portions 17 and 18 of wafer face 11 to form a pair of N-type source and drain regions 19 and 21 in wafer 10 immediately adjacent wafer face 11, and removing the silicon oxide layers 14 and 15, are similar to those described in Example I above.

The intrinsic silicon wafer 10 of Example II is now heated in a moisture-containing ambient to form silicon oxide layers 24 and 25 on wafer faces 11 and 12 respectively. Whereas in Example I, the ambient was steam, in this example the moisture-containing ambient consists of oxygen which has been bubbled through hot water.

Wafer 10 is now reheated for about two minutes at about 1000° C. in a dry ambient. In this example, the dry ambient consists of air which has been passed through a cold trap containing methanol and Dry Ice so as to freeze out any moisture present in the air. The wafer is cooled to room temperature in the same dry ambient. The inversion layer previously formed on the wafer surface by heating in a moisture-containing ambient (moist oxygen) is thus removed.

Openings 27 and 28 are then formed in silicon oxide layer 24 by the photolithographic techniques described above, and the wafer 10 is heated in an ambient of hydrogen to form a thin trap-free N-type surface layer 30 beneath the silicon oxide coating 24 on wafer face 11. The remaining steps of depositing metallic electrodes 41 and 43 on the two donor-diffused regions 19 and 21 respectively, and depositing metallic electrode 42 on the silicon oxide layer 24 over the conductive channel 30 and between electrodes 41 and 43, then attaching electrical lead wires 51, 52, and 53 to electrodes 41, 42, and 43 respectively, are similar to those described in Example I above.

An advantage of the various methods of fabricating semiconductor devices described above is that the conductive channel 30 in each unit formed from a particular silicon slice exhibits uniform resistivity from unit to unit. This uniformity is important, since it enables the production of a large number of devices with uniform and reproducible electrical characteristics.

Another advantage is that the conductive channel thus prepared is relatively thin, and relatively free from traps, hence current through the channel is easily modulated by the applied field generated when a bias is applied to the gate electrode.

Another feature of the invention is that the conductivity of the channel may be monitored and adjusted to the desired values prior to completing the fabrication of the device, thus reducing the amount of scrap. If desired, the conductivity of the channel may be continuously monitored while the silicon body is being heated in a hydrogen-containing ambient, so that the process can be stopped when the desired value is obtained for the conductivity of the channel.

Still another advantage is that the method is simple, rapid, and inexpensive as compared to prior art methods for fabricating such conductive channels. Moreover, the silicon oxide coating 24 which is left on the completed device is dense, free of defects and pinholes, and adheres tenaciously to the wafer surface.

It will be understood that the embodiments described above are by way of illustration and explanation only, but not limitation. Other conductive metals such as gold, palladium, chromium, and the like, may be utilized for the electrodes instead of aluminum. The conductive metal may be deposited by electroplating, or by electroless plating, instead of by evaporation. Various other modifications may be made without departing from the spirit and scope of the invention as described in the specification and appended claims.

What is claimed is:

1. The method of forming a conductive channel in a semiconductive device, comprising the steps of:

heating a crystalline silicon body in an oxidizing, moisture-containing ambient, the time and temperature of said heating step being sufficient to form a silicon oxide coating over the surface of said body;

exposing said silicon oxide coating to a dry non-reducing atmosphere and reheating said silicon body in said dry atmosphere, for a time and at a temperature sufficient to eliminate the inversion layer formed by the silicon oxide application and thus to reduce the density of charge carrier traps on the surface of said body; and, heating said body in a reducing atmosphere, for a time and at a temperature sufficient to reform in said body a thin conductive surface region immediately adjacent said silicon oxide coating, said surface region comprising said channel.

2. The method of fabricating a semiconductive device, comprising the steps of:

heating a crystalline semiconductive silicon body in a moisture-containing ambient for about ¼ to 4 hours at about 700 to 1300° C. to form a silicon oxide coating over the surface of said body;

exposing said silicon oxide coating to a dry non-reducing atmosphere and reheating said silicon body in said dry atmosphere for about 2 minutes to 10 hours at about 700 to 1300° C. to eliminate the inversion layer formed by the oxide application and thus to reduce the density of charge carrier traps on the surface of said body; and, heating said body in a reducing atmosphere for about 2 minutes to 2 hours at about 200 to 1000° C. to reform in said body a thin conductive surface region immediately adjacent said silicon oxide coating.

3. The method of fabricating a semiconductive device, comprising the steps of:

heating a crystalline silicon body in a moisture-containing atmosphere, the time and temperature of said heating step being sufficient to form a silicon oxide coating over the surface of said body;

exposing said silicon oxide coating to an atmosphere of dry oxygen and reheating said silicon body therein, for a time and at a temperature sufficient to eliminate the inversion layer formed by the silicon oxide application and thus to reduce the density of charge carrier traps on the surface of said body; and, heating said body in a hydrogen-containing reducing atmosphere, for a time and at a temperature sufficient to reform in said body a thin conductive surface region immediately adjacent said silicon oxide coating.

4. The method of fabricating a semiconductive device, comprising the steps of:

heating a crystalline silicon body in steam for about ¼ to 4 hours at about 700 to 1300° C. to form a silicon oxide coating on the surface of said body;

exposing said silicon oxide coating to dry oxygen and reheating said silicon body in said dry oxygen for about 2 minutes to 10 hours at about 700 to 1300° C. to eliminate the inversion layer formed by the silicon oxide application and thus to reduce the density of charge carrier traps on the surface of said body; and, exposing said silicon oxide coating to a hydrogen-containing reducing atmosphere and heating said body in said atmosphere for about 2 minutes to 2 hours at about 200 to 1000° C. to reform in said body a thin conductive surface region immediately adjacent said silicon oxide coating.

5. The method of fabricating a semiconductive device, comprising the steps of:

preparing a body of crystalline silicon having a conductivity type selected from the group consisting of P-type, intrinsic, and lightly doped N-type;

diffusing a donor selected from the group consisting of arsenic, antimony and phosphorus into two spaced portions of one face of said body to form two donor-diffused regions therein;

heating said body in a moisture-containing ambient for a time and temperature sufficient to form a silicon oxide coating on said face of said body;

exposing said silicon oxide coating to a dry non-reducing atmosphere and reheating said silicon body in said dry atmosphere, for a time and at a temperature sufficient to eliminate the inversion layer formed by the silicon oxide application and thus to reduce the density of charge carrier traps on the surface of said body;

making at least two openings in said silicon oxide coating to expose two areas of said one face of said body, one said exposed area being entirely within the surface boundary of one said donor-diffused portion, and the other said exposed area being entirely within the surface boundary of the other said donor-diffused portion; and, heating said body in a hydrogen-containing reducing ambient to reform in said body a thin conductive surface region immediately adjacent said silicon oxide coating.

References Cited

UNITED STATES PATENTS

| | | | |
|---|---|---|---|
| 2,873,222 | 2/1959 | Derick | 148—187 X |
| 2,879,190 | 3/1959 | Logan | 148—191 X |
| 2,981,646 | 4/1961 | Robinson | 148—1.5 |
| 3,034,211 | 5/1962 | Roehl | 29—494 X |
| 3,102,230 | 8/1963 | Kahng. | |
| 3,147,152 | 9/1964 | Mendel. | |
| 3,226,611 | 12/1965 | Haenichen | 317—234 |
| 3,226,614 | 12/1965 | Haenichen | 317—234 |

WILLIAM I. BROOKS, *Primary Examiner.*

JOHN F. CAMPBELL, *Examiner.*